United States Patent
Nasr et al.

(10) Patent No.: US 10,887,982 B2
(45) Date of Patent: Jan. 5, 2021

(54) VOLTAGE REGULATOR MODULE WITH COOLING STRUCTURE

(71) Applicant: Tesla, Inc., Palo Alto, CA (US)

(72) Inventors: Mohamed Nasr, Sunnyvale, CA (US); Aydin Nabovati, Redwood City, CA (US); Jin Zhao, San Jose, CA (US)

(73) Assignee: Tesla, Inc., Palo Alto, CA (US)

( * ) Notice: Subject to any disclaimer, the term of this patent is extended or adjusted under 35 U.S.C. 154(b) by 0 days.

(21) Appl. No.: 16/356,037

(22) Filed: Mar. 18, 2019

(65) Prior Publication Data

US 2019/0297723 A1 Sep. 26, 2019

Related U.S. Application Data

(60) Provisional application No. 62/646,835, filed on Mar. 22, 2018, provisional application No. 62/681,460, filed on Jun. 6, 2018.

(51) Int. Cl.
| | |
|---|---|
| *H05K 7/20* | (2006.01) |
| *H05K 1/02* | (2006.01) |
| *H02J 1/12* | (2006.01) |
| *G05F 1/10* | (2006.01) |

(52) U.S. Cl.
CPC ............ *H05K 1/0262* (2013.01); *G05F 1/10* (2013.01); *H02J 1/12* (2013.01); *H05K 1/0207* (2013.01); *H05K 7/2089* (2013.01)

(58) Field of Classification Search
CPC ...... H05K 1/0262; H05K 3/366; H05K 3/368; H05K 3/36
See application file for complete search history.

(56) References Cited

U.S. PATENT DOCUMENTS

| | | | |
|---|---|---|---|
| 7,278,853 B1 * | 10/2007 | Brodsky | H05K 3/366 439/289 |
| 8,009,420 B1 * | 8/2011 | Hill | G06F 1/20 361/679.54 |
| 8,946,567 B2 * | 2/2015 | Nakatsu | H01L 24/33 174/547 |
| 2015/0122465 A1 * | 5/2015 | Mori | F28F 3/022 165/104.33 |
| 2017/0254459 A1 * | 9/2017 | Chen | F16L 37/084 |

* cited by examiner

*Primary Examiner* — Mukundbhai G Patel
(74) *Attorney, Agent, or Firm* — Knobbe, Martens, Olson & Bear, LLP (57) ABSTRACT

A high-power Voltage Regulator Module (VRM) includes a housing having side walls, an upper opening, and a lower opening, a VRM circuit board oriented within the housing, a plane of the VRM circuit board oriented in parallel to at least one of the side walls of the housing, an upper Printed Circuit Board (PCB) coupled to the upper opening of the housing, a lower panel coupled to the lower opening of the housing, a coolant inlet port formed in the lower panel, and a coolant outlet port formed in the lower panel. The high power VRM may include a coolant inlet adapter coupled to the coolant inlet port and a coolant outlet adapter coupled to the coolant outlet port. The coolant inlet adapter and the coolant outlet adapter may provide support for the VRM.

20 Claims, 9 Drawing Sheets

VOLTAGE REGULATOR MODULE WITH COOLING STRUCTURE

CROSS REFERENCES TO RELATED PATENTS

The present U.S. Utility Patent Application claims priority pursuant to 35 U.S.C. § 119(e) to U.S. Provisional Application No. 62/646,835, entitled "VOLTAGE REGULATOR MODULE WITH COOLING STRUCTURE", filed Mar. 22, 2018, and to U.S. Provisional Application No. 62/681,460, entitled "VOLTAGE REGULATOR MODULE WITH COOLING STRUCTURE", filed Jun. 6, 2018, both of which are hereby incorporated herein by reference in their entirety and made part of the present U.S. Utility Patent Application for all purposes.

BACKGROUND

Technical Field

The present disclosure relates generally to electronics, and more specifically to voltage regulator modules.

Description of Related Art

Switching power supplies are generally known. One application of a switching power supply is to convert an input voltage, e.g., input DC voltage to a lower DC voltage to drive an Integrated Circuit (IC). A Voltage Regulator Module (VRM) may be used to convert a voltage received from a battery or other DC source to a lower voltage for use by the IC. The requirement of high power for the ICs, e.g., in excess of 500 watts, at relatively low voltages, e.g., less than one volt, creates problems for the VRM. The VRM must supply a relatively low DC voltage at many hundreds of amperes. Typically, VRMs are space constrained but must still include necessary components to produce clean power at a low voltage and with high current.

The VRMs require substantial capacitance to condition their output DC voltage. It is difficult to include this substantial capacitance in a small form factor device, e.g., small foot print. Prior capacitor arrays typically required a relatively large foot print, which limited the foot print size of the VRM. This shortcoming of prior capacitor arrays introduced similar problems with other electronics that had both a high capacitance requirement and a small footprint requirement.

Further, the VRMs generate substantial heat in their operation. This heat must be removed to avoid degradation and/or destruction of the components of the VRMs, e.g., ICs, Printed Circuit Boards (PCBs), connectors, capacitors, inductors, resistors, etc.

Embodiments of the present disclosure and their advantages are best understood by referring to the detailed description that follows. It should be appreciated that like reference numerals are used to identify like elements illustrated in one or more of the figures, wherein showings therein are for purposes of illustrating embodiments of the present disclosure and not for purposes of limiting the same.

DETAILED DESCRIPTION

Figure 1:
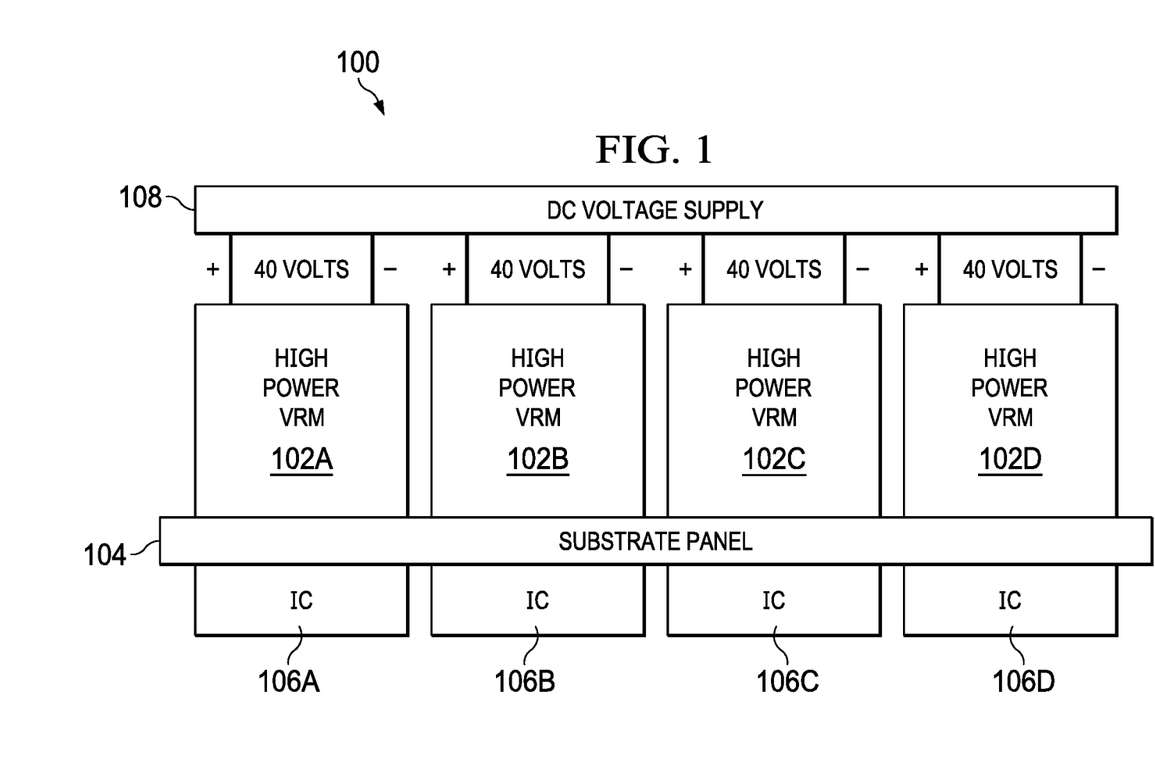
FIG. 1 is a block diagram illustrating a processing system that includes a plurality of multiple circuit board high power Voltage Regulator Modules (VRMs) constructed according to the present disclosure.

FIG. 1 is a block diagram illustrating a processing system that includes a plurality of multiple circuit board high power Voltage Regulator Modules (VRMs) constructed according to the present disclosure. The processing system 100 of FIG. 1 includes a plurality of multiple circuit board high power VRMs 102A, 102B, 102C, and 102D constructed according to the present disclosure that mounted on a substrate panel 104. The plurality of multiple circuit board high power VRMs 102A, 102B, 102C, and 102D are fed by a DC supply voltage 108, e.g., 40 volts, 48 volts, or another relatively voltage, and respectively service a respective plurality of Integrated Circuits (ICs) 106A, 106B, 106C, and 106D. In some embodiments, each of the plurality of multiple circuit board high power VRMs 102A, 102B, 102C, and 102D produces an output of approximately 0.8 volts and provides 600 watts of power or more to the respective plurality of ICs 106A, 106B, 106C, and 106D. Thus, each of the plurality of multiple circuit board high power VRMs 102A, 102B, 102C, and 102D produces in excess of 100 amperes of current to the plurality of ICs 106A, 106B, 106C, and 106D.

Because each of the plurality of multiple circuit board high power VRMs 102A, 102B, 102C, and 102D produces an output of approximately 0.8 volts to the respective plurality of ICs 106A, 106B, 106C, and 106D and it is desirable for the footprint of the VRMs 102A-102D to be approximately the same as the footprints of the plurality of ICs 106A-106D, the footprint of the plurality of VRMs 102A-102D is limited. In some embodiments, the footprint is approximately 3 centimeters by 3 centimeters, 4 centimeters by 4 centimeters, or other relatively small dimensions that approximate the cross section of the plurality of ICs 106A, 106B, 106C, and 106D. However, in order to produce power at low voltage and high power, the plurality of VRMs 102A-102D must include a relatively large number of discrete components.

Thus, according to the present disclosure, the plurality of multiple circuit board high power VRMs 102A, 102B, 102C, and 102D include circuit boards that are disposed in planes both parallel to the substrate panel 104 and in planes perpendicular to the substrate panel 104. One embodiment that will be described with reference to FIGS. 2, 3A, and 3B includes two circuit boards oriented perpendicular to the substrate panel 104 and two circuit boards oriented parallel to the substrate panel 104. With this structure, the VRMs 102A, 102B, 102C, and 102D extend above the substrate panel 104 in a direction perpendicular to the substrate panel.

Figure 2:
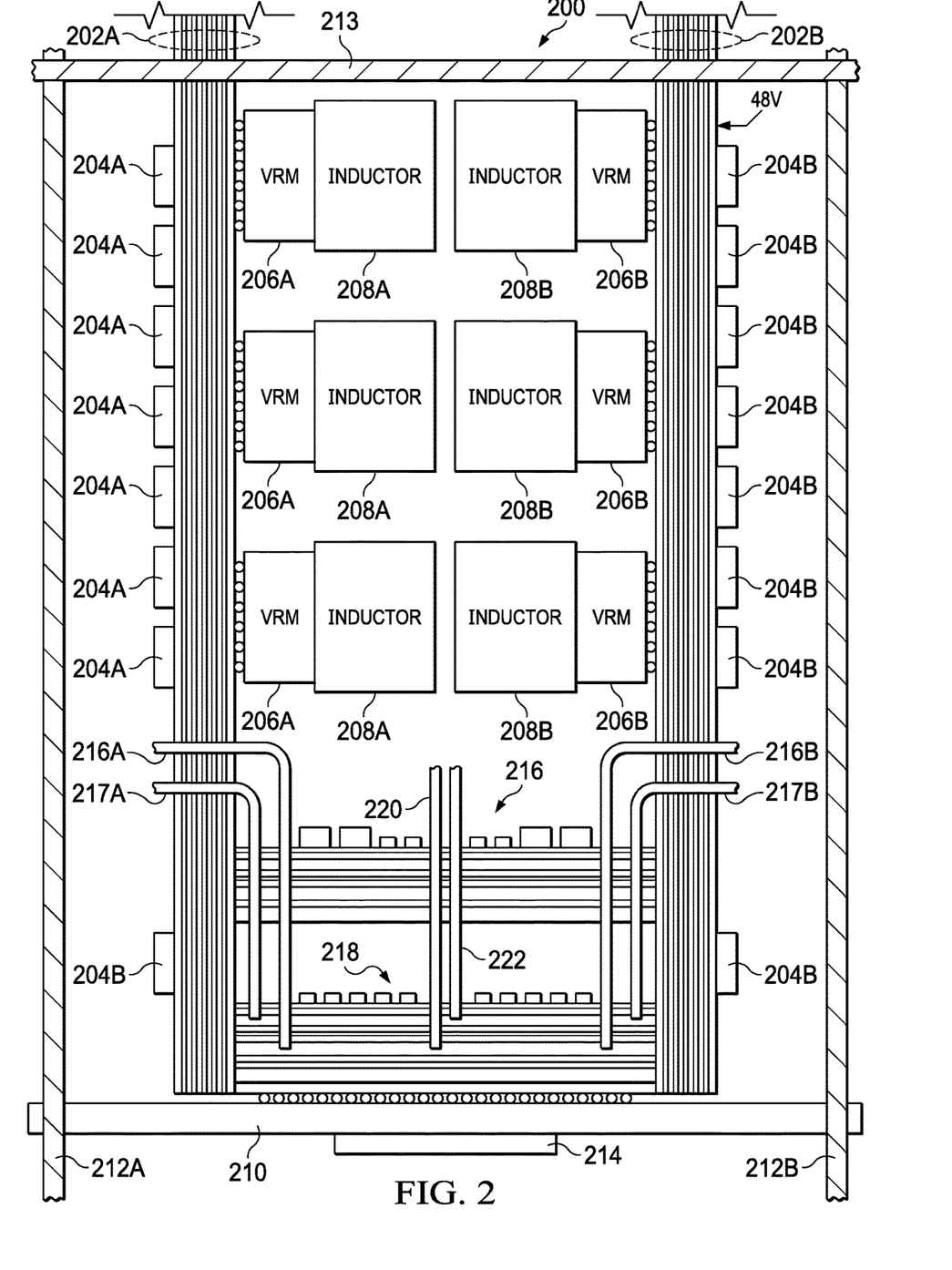
FIG. 2 is a block schematic diagram illustrating a multiple circuit board high power VRM according to the present disclosure.

FIG. 2 is a block schematic diagram illustrating a multiple circuit board high power VRM according to the present disclosure. The multiple circuit board high power VRM 200 includes a first voltage rail circuit board 202A, a second voltage rail circuit board 202B, a first capacitor circuit board 216, and a second capacitor circuit board 218. These components are mounted on rails 212A and 212B and on top brace 213, the rails 212A and 212B coupling to a substrate panel 210 using screws, for example. The second capacitor board 218 may couple to the substrate panel 210 via solder balls, which may have a pitch of 1 mm. The electrical connection formed by the substrate panel 210 couples a first rail voltage and a second rail voltage to die 214 mounted on an opposite side of the substrate panel 210.

The first voltage rail circuit board 202A is oriented in a first plane, has formed therein a first plurality of conductors (in a plurality of layers), and having mounted thereon a first plurality of VRM elements 206A, a first plurality of inductors 208A coupled to the first plurality of VRM elements 206A, and a first plurality of capacitors 204A. The first voltage rail circuit board 202A is configured to receive a first voltage and to produce the first rail voltage. The second voltage rail circuit board 202B is oriented in a second plane that is substantially parallel to the first plane, includes a second plurality of conductors formed therein (in a plurality of layers), and has mounted thereon a second plurality of VRM elements 206B, a second plurality of inductors 208B coupled to the second plurality of VRM elements 206B, and a second plurality of capacitors 204B. The second voltage rail circuit board 202B is configured to receive a second voltage and to produce the second rail voltage. The first and second voltages may be received from a battery pack within an electric vehicle.

The first capacitor circuit board 216 is oriented in a third plane that is substantially perpendicular to the first plane and has formed therein a third plurality of conductors. The first capacitor circuit board has mounted thereon a third plurality of capacitors. The second capacitor circuit board 218 is oriented in a fourth plane that is substantially parallel to the third plane and includes, has formed therein, a fourth plurality of conductors, and has mounted thereon a fourth plurality of capacitors.

The multiple circuit board high power VRM 200 further includes a fifth plurality of conductors 216A and 217A coupling the first voltage rail circuit board 202A to the first capacitor circuit board 216 and to the second capacitor circuit board 218. The multiple circuit board high power VRM 200 further includes a sixth plurality of conductors 216B and 217B coupling the second voltage rail circuit board 202B to the first capacitor circuit board 216 and to the second capacitor circuit board 216. The high power VRM of claim 1, further comprising a seventh plurality of conductors 220 and 222 coupling the first capacitor circuit board 216 to the second capacitor circuit board 218.

Figure 3A:
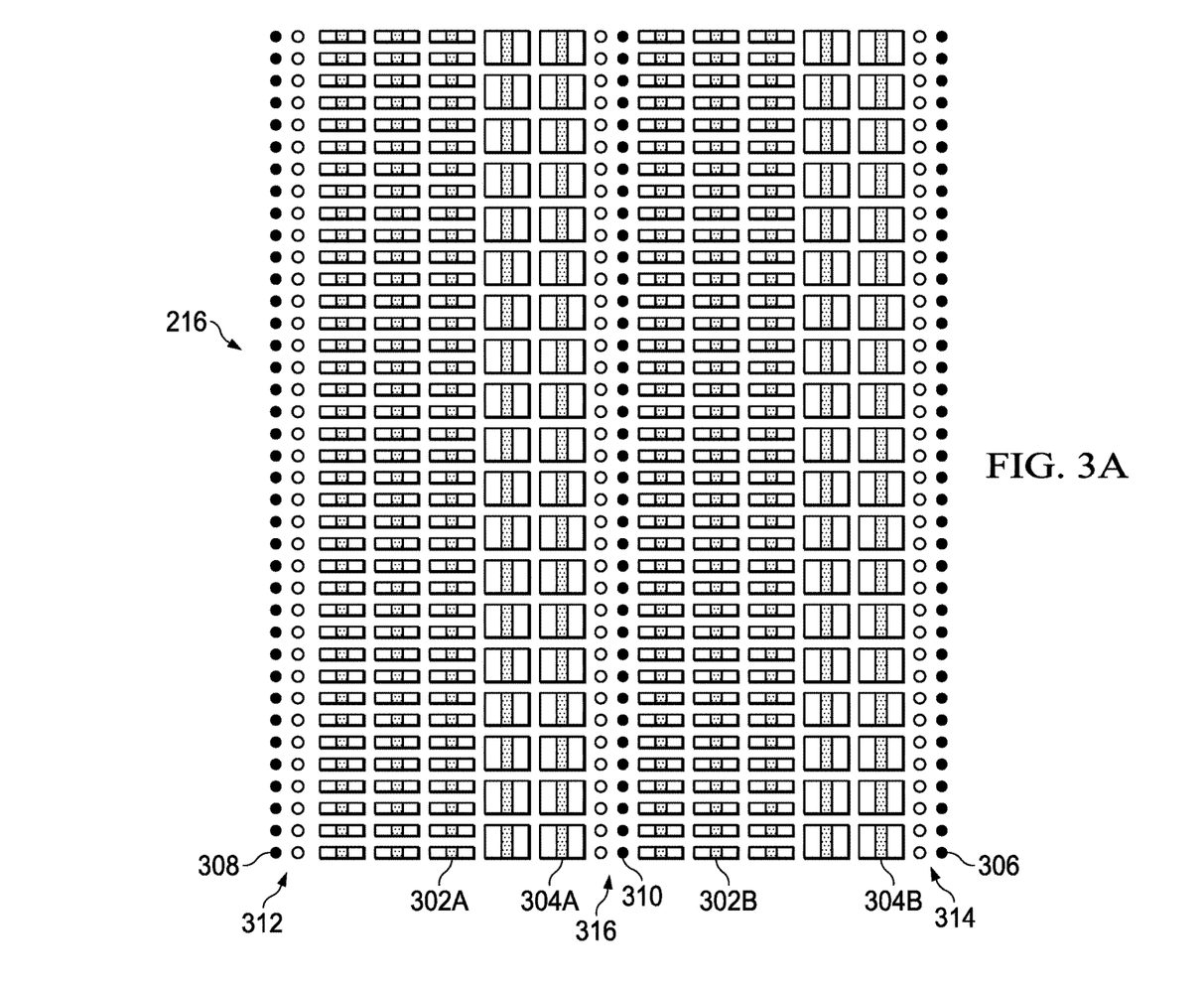
FIG. 3A is a block schematic diagram illustrating a first capacitor circuit board of the multiple circuit board high power VRM of FIG. 2.

FIG. 3A is a block schematic diagram illustrating a first capacitor circuit board of the multiple circuit board high power VRM of FIG. 2. The first capacitor circuit board 216 includes the third plurality of capacitors 302A, 304A, 302B, and 304B. Note that the capacitors 302A and 304A are located on a first side of the first capacitor circuit board 216 and that the capacitors 302B and 304B are located on a second side of the first capacitor circuit board 216. The fifth plurality of conductors 216A and 217A couple to connectors 308 of the first capacitor circuit board 216. Further, the sixth plurality of conductors 216B and 217B couple to connectors 306 of the first capacitor circuit board 216. The seventh plurality of conductors 220 and 222 couple to connectors 310 of the first capacitor circuit board 216.

Figure 3B:
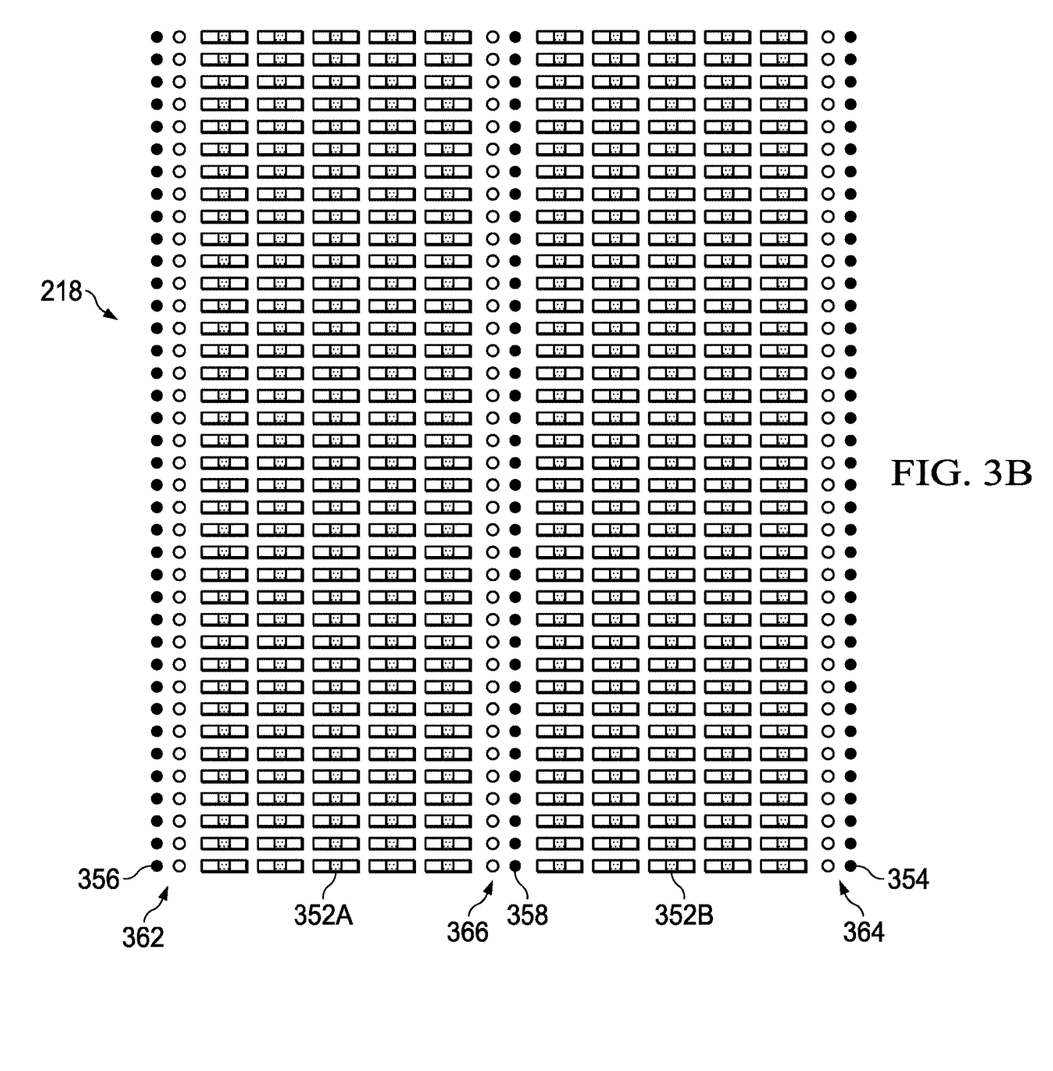
FIG. 3B is a block schematic diagram illustrating a second capacitor circuit board of the multiple circuit board high power VRM of FIG. 2.

FIG. 3B is a block schematic diagram illustrating a second capacitor circuit board of the multiple circuit board high power VRM of FIG. 2. The second capacitor circuit board 218 includes the fourth plurality of capacitors 352A, 354A, 352B, and 354B. Note that the capacitors 352A and 354A are located on a first side of the second capacitor circuit board 218 and that the capacitors 352B and 354B are located on a second side of the second capacitor circuit board 218. The fifth plurality of conductors 216A and 217A couple to connectors 356 of the second capacitor circuit board 218. Further, the sixth plurality of conductors 216B and 217B couple to connectors 354 of the second capacitor circuit board 218. The seventh plurality of conductors 220 and 222 couple to connectors 358 of the second capacitor circuit board 218.

Referring to both FIGS. 3A and 3B, the fifth plurality of conductors 216A and 217A couples to a first outer portion 312 of the first capacitor circuit board 216 and to a first outer portion 362 of the second capacitor circuit board 218. Further the sixth plurality of conductors 216B and 217B couples to a second outer portion 314 of the first capacitor circuit board 216 and to a second outer portion 364 of the second capacitor circuit board 218. Moreover, the seventh plurality of conductors 220 and 222 couples between a central portion 316 of the first capacitor circuit board 216 and a central portion 366 of the second capacitor circuit board 318.

Still referring to both FIGS. 3A and 3B, the third plurality of capacitors 302A, 304A, 302B, and 304B are configured to filter medium to low frequency components of the first rail voltage and the second rail voltage and the fourth plurality of capacitors 352A and 352B are configured to filter high frequency components of the first rail voltage and the second rail voltage.

With the embodiments of FIGS. 2, 3A and/or 3B, the input voltage received by the first voltage rail circuit board 202A and the second voltage rail circuit board 202B may be 40 voltages with 0.8-volt signals used for communications therewith.

Figure 4:
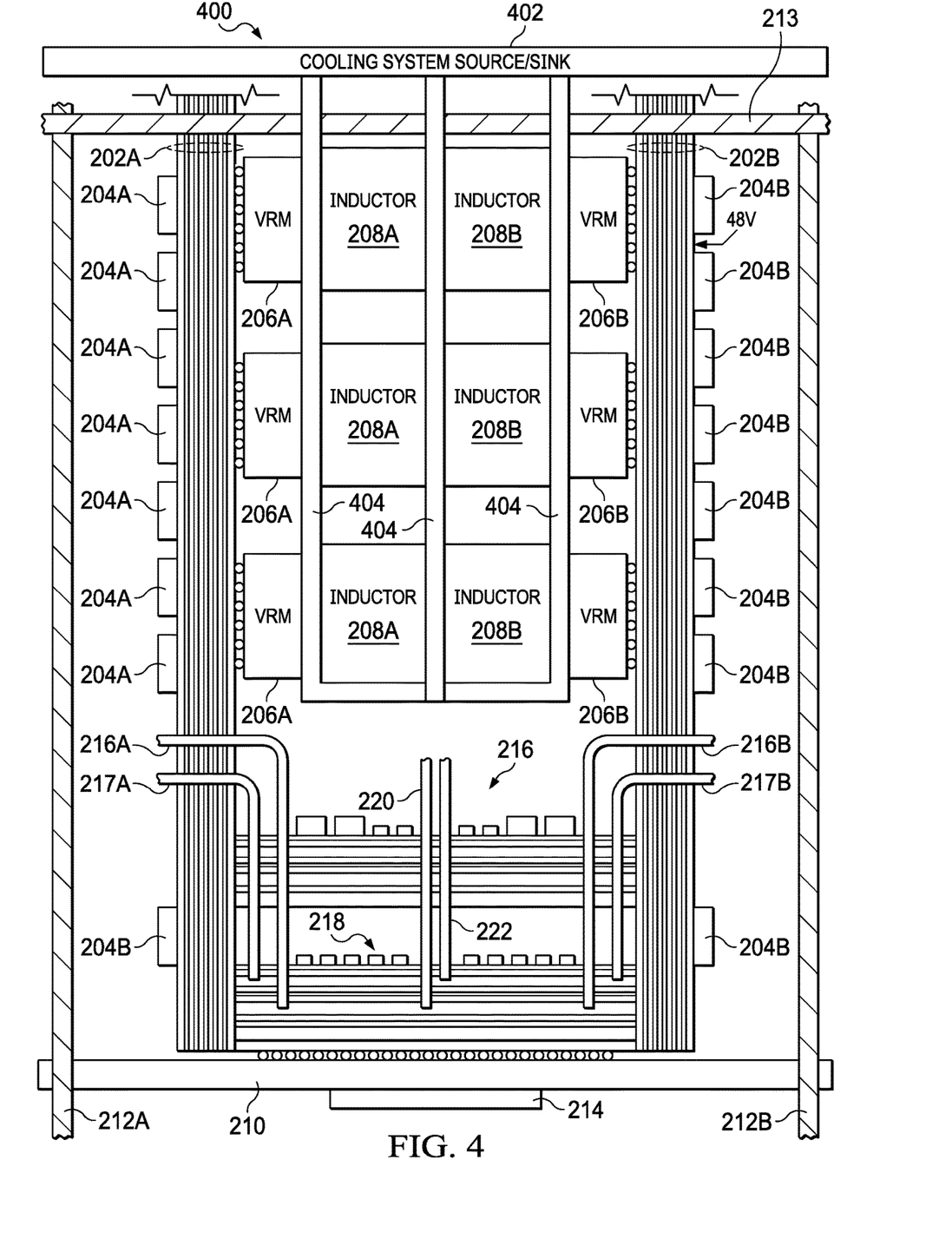
FIG. 4 is a block schematic diagram illustrating cooling system components of a multiple circuit board high power VRM according to the present disclosure.

FIG. 4 is a block schematic diagram illustrating cooling system components of a multiple circuit board high power VRM according to the present disclosure. The difference between the embodiment 200 of FIG. 2 and the embodiment 400 of FIG. 4 is the inclusion of the cooling system components. The first plurality of VRM elements 206A, the first plurality of inductors 208A, the second plurality of VRM elements 206B, the second plurality of inductors 208B produce significant heat in their operation. Thus, the multiple circuit board high power VRM includes a cooling system to cool these components. A cooling system source/sink 402 couples to piping 404 to service the flow of coolant to cool the VRM elements 206A/206B and the inductors 208A/208B. The piping 404 may include many segments. The piping 404 may couple directly to the VRM elements 206A/206B and the inductors 208A/208B or be thermally coupled thereto by intermediate structures. The cooling system source/sink 402 may service multiple circuit board high power VRMs as were illustrated in FIG. 1.

Figure 5:
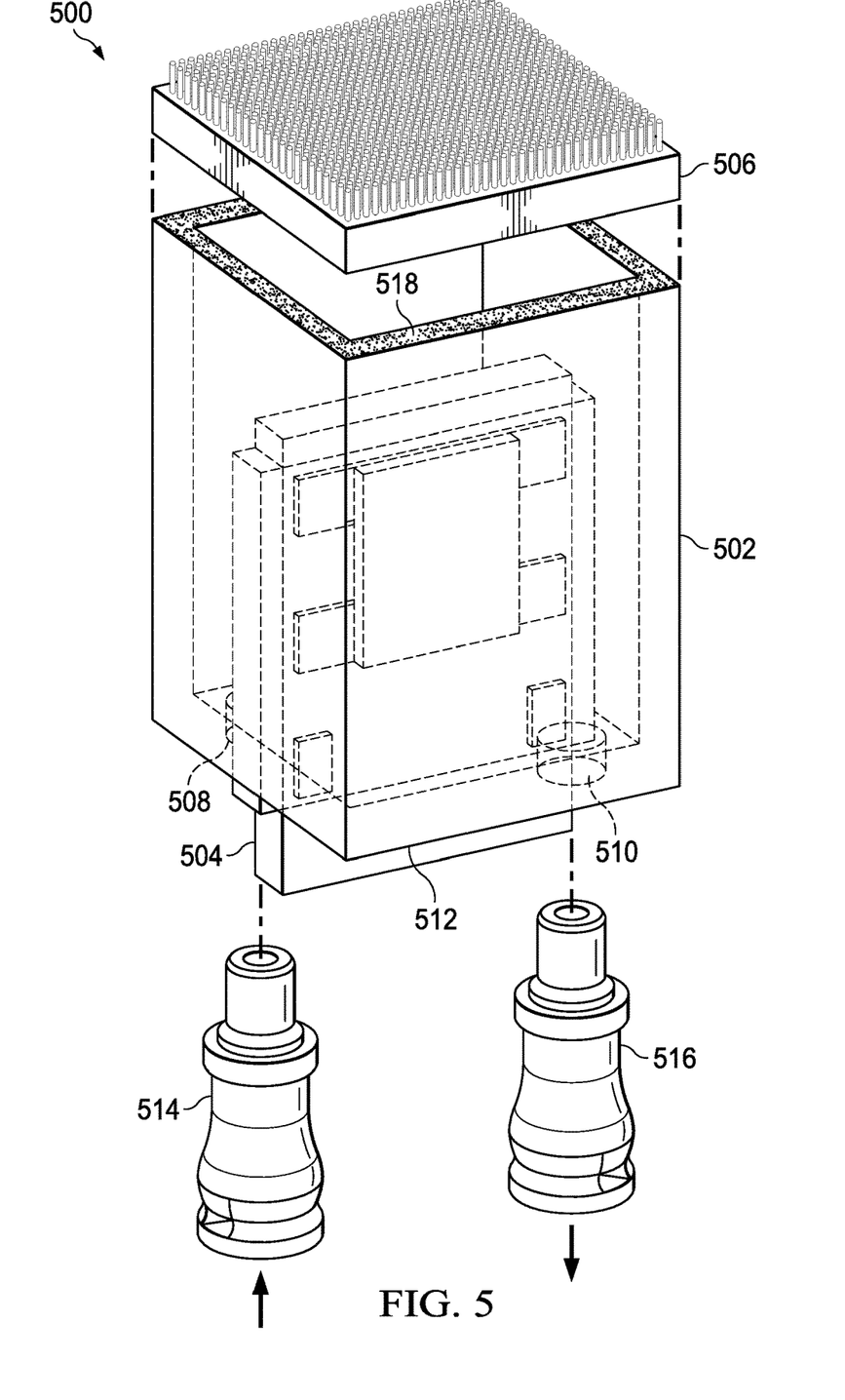
FIG. 5 is a partially exploded view of a VRM with a cooling structure according to an embodiment of the present disclosure.

FIG. 5 is a partially exploded view of a VRM with a cooling structure according to an embodiment of the present disclosure.

Figure 6:
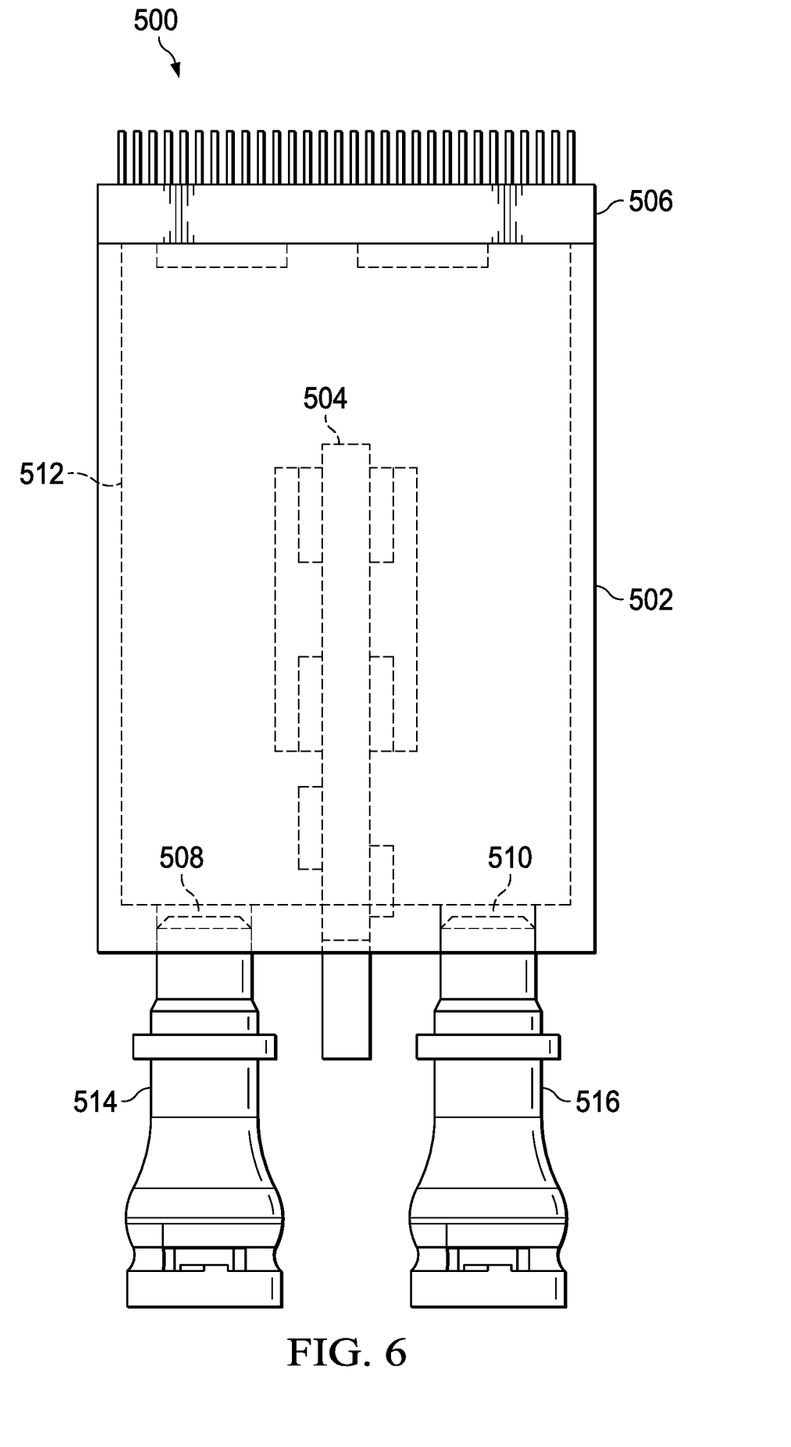
FIG. 6 is a sectional side view illustrating components of the VRM of FIG. 5 detailing coolant flow.

FIG. 6 is a sectional side view illustrating components of the VRM of FIG. 5 detailing coolant flow.

Figure 7:
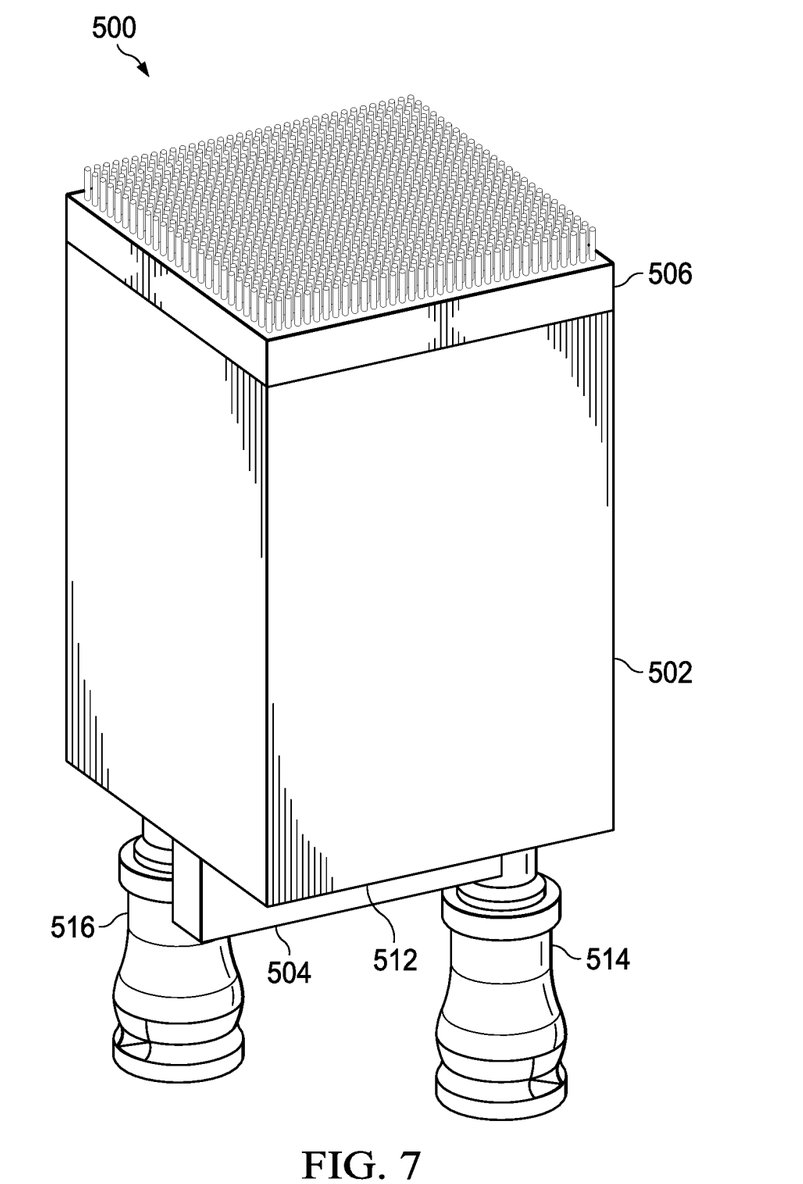
FIG. 7 is a perspective view of the VRM of FIG. 5 in an assembled state.

FIG. 7 is a perspective view of the VRM of FIG. 5 in an assembled state. Referring to all of FIGS. 5, 6, and 7, the VRM 500 includes a housing 502 having side walls, an upper opening, and a lower opening. The housing 502 may be formed of metal and may be formed in multiple pieces, bonded to each other by welding or glue. The VRM further includes a VRM circuit board 504 oriented within the housing 502. A plane of the VRM circuit board 504 orients in parallel (or substantially in parallel) to at least one of the side walls of the housing 502. While the housing 502 is shown to have four side walls, it may have 3 or more than 4 side walls. Further, while a single VRM circuit board 504 is shown within the housing 502, in other embodiments, more than one VRM circuit board 504 may be contained within the housing 502.

The VRM 500 further includes an upper Printed Circuit Board (PCB) 506 sealed to an upper opening of the housing 502. The upper PCB 506 may attach to the housing via an adhesive 518, which may be an adhesive tape applied to the housing 502 at the upper opening. The VRM 500 further includes a lower panel 512, which is shown transparently in FIGS. 5 and 6 and couples to the housing 502 at the lower opening. The VRM 500 further includes a coolant inlet port 508 formed in the lower panel 512 and a coolant outlet port 510 formed in the lower panel.

The VRM 500 may further include a coolant inlet adapter 514 coupled to the coolant inlet port 508 having an inlet quick disconnect. The VRM 500 may also include a coolant outlet adapter 516 coupled to the coolant outlet port 510 and having an outlet quick disconnect. The coolant inlet adapter 514 and the coolant outlet adapter 516 may provide weight support for the VRM 500. A coolant feed tube couples to the coolant inlet adapter 514 to provide coolant, which is a dielectric to prevent electrical conduction by the coolant. In some embodiments, the coolant is a gas. In other embodiments, the coolant is a liquid. A coolant exhaust tube couples to the coolant outlet adapter 514. A temperature sensor inside the housing 502 or upon the VRM circuit board 504 may provide feedback to determine at what temperature to provide the coolant and at what rate to flow the coolant within the housing 502 to adequately cool the components within the housing.

According to an optional aspect of the VRM 500, the VRM circuit board 504 extends below the lower opening of the housing 502 and the lower panel 512 includes an opening through which the VRM circuit board 504 extends. In such case, the opening in the lower panel 512 through which the VRM circuit board 504 extends is sealed to the VRM circuit board 504.

The VRM circuit board 504 may convert a voltage from approximately 40-50 volts to approximately 3-6 volts and the upper PCB 506 may convert a voltage from approximately 3-6 volts to approximately 0.5 volts to 1.5 volts.

Figure 8:
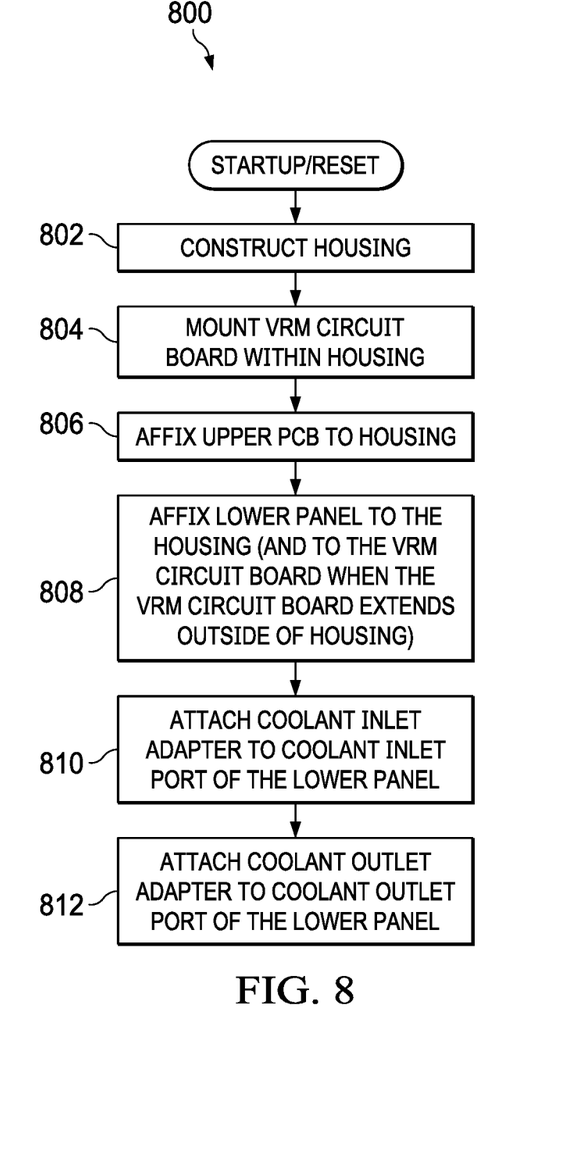
FIG. 8 is a flow chart describing construction of the VRM of FIG. 5.

FIG. 8 is a flow chart describing construction of the VRM of FIG. 5. Operations 800 begin by constructing a housing (step 802). Then, operations 800 include mounting a VRM circuit board within the housing (step 804). Operations 800 next include affixing the upper PCB to the housing (step 806). Operations 800 continue with affixing a lower panel to the housing (and the VRM circuit board at step 808). Operations 800 conclude with attaching a coolant inlet adapter to a coolant inlet port of the lower panel (step 810) and attaching a coolant outlet adapter to the coolant outlet port (step 812).

The system and methods above has been described in general terms as an aid to understanding details of preferred embodiments of the present disclosure. Other preferred embodiments of the present include the described application for electric vehicles. In the description herein, numerous specific details are provided, such as examples of components and/or methods, to provide a thorough understanding of embodiments of the present disclosure. One skilled in the relevant art will recognize, however, that an embodiment of the disclosure can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present disclosure.

Reference throughout this specification to "one embodiment", "an embodiment", or "a specific embodiment" means that a particular feature, structure, or characteristic described in connection with the embodiment is included in at least one embodiment of the present disclosure and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present disclosure may be combined in any suitable manner with one or more other embodiments. It is to be understood that other variations and modifications of the embodiments of the present disclosure described and illustrated herein are possible in light of the teachings herein and are to be considered as part of the spirit and scope of the present disclosure.

It will also be appreciated that one or more of the elements depicted in the drawings/figures can also be implemented in a more separated or integrated manner, or even removed or rendered as inoperable in certain cases, as is useful in accordance with a particular application.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present disclosure, including what is described in the Abstract, is not intended to be exhaustive or to limit the disclosure to the precise forms disclosed herein. While specific embodiments of, and examples for, the disclosure are described herein for illustrative purposes only, various equivalent modifications are possible within the spirit and scope of the present disclosure, as those skilled in the relevant art will recognize and appreciate. As indicated, these modifications may be made to the present disclosure in light of the foregoing description of illustrated embodiments of the present disclosure and are to be included within the spirit and scope of the present disclosure.

Thus, while the present disclosure has been described herein with reference to particular embodiments thereof, a latitude of modification, various changes and substitutions are intended in the foregoing disclosures, and it will be appreciated that in some instances some features of embodiments of the disclosure will be employed without a corresponding use of other features without departing from the scope and spirit of the disclosure as set forth. Therefore, many modifications may be made to adapt a particular situation or material to the essential scope and spirit of the present disclosure. It is intended that the disclosure not be limited to the particular terms used in following claims and/or to the particular embodiment disclosed as the best mode contemplated for carrying out this disclosure, but that the disclosure will include any and all embodiments and equivalents falling within the scope of the appended claims. Thus, the scope of the disclosure is to be determined solely by the appended claims.

What is claimed is:

1. A high-power Voltage Regulator Module (VRM) comprising:
   a housing having side walls, an upper opening, and a lower opening, the side walls, upper opening, and lower opening forming a cavity which receives a dielectric coolant;
   a VRM circuit board oriented within the housing, a plane of the VRM circuit board oriented in parallel to at least one of the side walls of the housing;
   an upper Printed Circuit Board (PCB) coupled to the upper opening of the housing;
   a lower panel coupled to the lower opening of the housing;
   a coolant inlet port formed in the lower panel, the coolant inlet port receiving the dielectric coolant to allow the dielectric coolant to flow into the formed cavity in direct contact with the VRM circuit board; and
   a coolant outlet port formed in the lower panel.

2. The high power VRM of claim 1, further comprising:
   a coolant inlet adapter coupled to the coolant inlet port; and
   a coolant outlet adapter coupled to the coolant outlet port.

3. The high power VRM of claim 2, further comprising:
   the coolant inlet adapter having an inlet quick disconnect; and
   the coolant outlet adapter having an outlet quick disconnect.

4. The high power VRM of claim 2, wherein the coolant inlet adapter and the coolant outlet adapter provide support for the VRM.

5. The high power VRM of claim 1, wherein:
   the VRM circuit board extends below the lower opening; and
   the lower panel includes an opening through which the VRM circuit board extends.

6. The high power VRM of claim 1, wherein:
   the VRM circuit board converts voltage from approximately 40-50 volts to approximately 3-6 volts; and
   the upper PCB converts voltage from approximately 3-6 volts to approximately 0.5 volts to 1.5 volts.

7. The high power VRM of claim 1, wherein the housing is formed of metal.

8. The high power VRM of claim 1, wherein the upper PCB is sealed to the upper opening of the housing by an adhesive.

9. The high power VRM of claim 1, wherein:
   the VRM circuit board extends through the lower opening of the housing; and
   the lower panel includes an opening through which the VRM circuit board extends, wherein the opening in the lower panel is sealed to the VRM circuit board.

10. The high power VRM of claim 1, wherein:
    the coolant inlet port resides in the lower panel on a first side of the VRM circuit board; and
    the coolant outlet port resides in the lower panel on a second side of the VRM circuit board.

11. The high power VRM of claim 10, wherein the coolant inlet port, the coolant outlet port, and the VRM circuit board are oriented to support coolant flow of the coolant:
    in through the coolant inlet port;
    up along the first side of the VRM circuit board;
    over a far edge of the VRM circuit board;
    down along the second side of the VRM circuit board; and
    out through the coolant outlet port.

12. A method for forming a high-power Voltage Regulator Module (VRM) comprising:
    forming a housing having side walls, an upper opening, and a lower opening, the side walls, upper opening, and lower opening forming a cavity which receives a dielectric coolant;
    mounting a VRM circuit board within the housing, a plane of the VRM circuit board oriented in parallel to at least one of the side walls of the housing;
    affixing an upper Printed Circuit Board (PCB) to the upper opening of the housing; and
    affixing a lower panel to the lower opening of the housing, the lower panel having a coolant inlet port formed in the lower panel and a coolant outlet port formed in the lower panel, the coolant inlet port receiving the dielectric coolant to allow the dielectric coolant to flow into the formed cavity in direct contact with the VRM circuit board.

13. The method of claim 12, further comprising:
    attaching a coolant inlet adapter to the coolant inlet port; and
    attaching a coolant outlet adapter to the coolant outlet port.

14. The method of claim 13, wherein the coolant inlet adapter and the coolant outlet adapter provide support for the VRM.

15. The method of claim 12, wherein:
    the VRM circuit board extends below the lower opening; and
    the lower panel includes an opening through which the VRM circuit board extends.

16. The method of claim 12, wherein:
    the VRM circuit board converts voltage from approximately 40-50 volts to approximately 3-6 volts; and
    the upper PCB converts voltage from approximately 3-6 volts to approximately 0.5 volts to 1.5 volts.

17. The method of claim 12, wherein the upper PCB is sealed to the upper opening of the housing by an adhesive.

18. The method of claim 12, wherein:
    the VRM circuit board extends through the lower opening of the housing; and
    the lower panel includes an opening through which the VRM circuit board extends, wherein the opening in the lower panel is sealed to the VRM circuit board.

19. The method of claim 12, wherein:
    the coolant inlet port resides in the lower panel on a first side of the VRM circuit board; and
    the coolant outlet port resides in the lower panel on a second side of the VRM circuit board.

20. The method of claim 19, wherein the coolant inlet port, the coolant outlet port, and the VRM circuit board are oriented to support coolant flow of the coolant:
    in through the coolant inlet port;
    up along the first side of the VRM circuit board;

over a far edge of the VRM circuit board;
down along the second side of the VRM circuit board; and
out through the coolant outlet port.

* * * * *